(12) United States Patent
Pigeat et al.

(10) Patent No.: US 12,161,257 B2
(45) Date of Patent: Dec. 10, 2024

(54) STAIN-RESISTANT COOKING SURFACE AND COOKWARE ITEM OR ELECTRICAL HOUSEHOLD APPLIANCE COMPRISING SUCH A COOKING SURFACE

(71) Applicants: SEB S.A., Ecully (FR); Universite de Lorraine, Nancy (FR); Centre National De La Recherche Scientifique, Paris (FR)

(72) Inventors: Philippe Pigeat, Nancy (FR); Jean-Francois Pierson, Vincey (FR); Alexandre Mege-Revil, Villeneuve d'Ascq (FR); Frederic Tessier, Beauvais (FR); Simon Allemand, Rumilly (FR); Stephane Tuffe, Cognin (FR)

(73) Assignees: Centre National De La Recherche Scientifique, Paris (FR); SEB S.A., Ecully (FR); Universite de Lorraine, Nancy (FR)

( * ) Notice: Subject to any disclaimer, the term of this patent is extended or adjusted under 35 U.S.C. 154(b) by 0 days.

(21) Appl. No.: 14/359,309

(22) PCT Filed: Nov. 19, 2012

(86) PCT No.: PCT/EP2012/073007
§ 371 (c)(1),
(2) Date: May 20, 2014

(87) PCT Pub. No.: WO2013/076046
PCT Pub. Date: May 30, 2013

(65) Prior Publication Data
US 2014/0311358 A1   Oct. 23, 2014

(30) Foreign Application Priority Data
Nov. 21, 2011 (FR) .................................. 1160583

(51) Int. Cl.
*A47J 36/02* (2006.01)
*C23C 14/00* (2006.01)
(Continued)

(52) U.S. Cl.
CPC ........... *A47J 36/02* (2013.01); *C23C 14/0036* (2013.01); *C23C 14/025* (2013.01);
(Continued)

(58) Field of Classification Search
CPC .... A47J 36/02; C23C 14/025; C23C 14/0036; C23C 14/0641; Y10T 428/31678; Y10T 428/265
(Continued)

(56) References Cited

U.S. PATENT DOCUMENTS

| | | | | |
|---|---|---|---|---|
| 5,220,140 A | * | 6/1993 | Ball .................. | B65D 81/3446 156/150 |
| 6,197,438 B1 | * | 3/2001 | Faulkner .............. | A47J 27/022 428/627 |

(Continued)

FOREIGN PATENT DOCUMENTS

| | | |
|---|---|---|
| FR | 2848797 A1 | 12/2002 |
| FR | 2883150 A1 | 3/2005 |

(Continued)

*Primary Examiner* — Hung D Nguyen
(74) *Attorney, Agent, or Firm* — The Webb Law Firm

(57) ABSTRACT

Provided is a food cooking surface for a cookware item or an electrical household cooking appliance, consisting of a deposit of nitride of metal elements on a substrate, the metal elements of the deposit comprising one or more X transition metal(s) and aluminium. The production of the deposit comprises a nitridation step in arder to obtain a coating of type (X,Al)N. According to the invention, the (X,Al)N-type coating is a coating of nitride(s) of the one or more X transition metal(s), enriched with aluminium, in which niobium and/or zirconium is/are make up the most part of the (Continued)

X transition metal(s), the atomic ratio of aluminium in the metal elements of the deposit being at least equal to 20%. Also provided are cookware items and electrical household appliances intended for the cooking of food, comprising the above-mentioned type of cooking surface.

12 Claims, 1 Drawing Sheet

(51) Int. Cl.
 *C23C 14/02* (2006.01)
 *C23C 14/06* (2006.01)
(52) U.S. Cl.
 CPC ....... *C23C 14/0641* (2013.01); *Y10T 428/265* (2015.01); *Y10T 428/31678* (2015.04)
(58) Field of Classification Search
 USPC ............... 99/422, 403, 426, 447; 126/390.1; 428/172, 336, 457, 450, 627; 219/443.1; 392/309
 See application file for complete search history.

(56) References Cited

U.S. PATENT DOCUMENTS

| | | | |
|---|---|---|---|
| 6,617,057 B2* | 9/2003 | Gorokhovsky | C23C 14/022 428/156 |
| 8,070,010 B2 | 12/2011 | Coudurier | |
| 8,322,273 B2* | 12/2012 | Coudurier | A47J 36/02 99/422 |
| 2001/0054638 A1* | 12/2001 | Hardwick | B23K 20/227 228/107 |
| 2003/0022027 A1* | 1/2003 | Groll | A47J 36/02 428/698 |
| 2003/0044619 A1* | 3/2003 | Leech | C08L 27/18 428/421 |
| 2004/0022346 A1* | 2/2004 | Kim | C23C 8/16 376/305 |
| 2004/0166378 A1* | 8/2004 | Ge | C23C 14/0641 428/698 |
| 2004/0191579 A1* | 9/2004 | Ge | A47J 36/04 428/698 |
| 2004/0261932 A1* | 12/2004 | Buffard | B05D 5/083 156/89.11 |
| 2005/0249886 A1* | 11/2005 | Ge | C23C 14/025 427/446 |
| 2008/0081211 A1 | 4/2008 | Tuffe et al. | |
| 2008/0187717 A1* | 8/2008 | Hort | B05D 5/083 428/141 |
| 2009/0042056 A1* | 2/2009 | Bewlay | B32B 15/01 428/662 |
| 2009/0165656 A1* | 7/2009 | Coudurier | A47J 36/025 99/324 |
| 2010/0140276 A1* | 6/2010 | Cuillery | A47J 36/02 220/573.2 |
| 2010/0255340 A1* | 10/2010 | Ge | A47J 36/02 428/655 |
| 2011/0198358 A1* | 8/2011 | Parent | A47J 36/02 220/573.1 |
| 2011/0271872 A1* | 11/2011 | Lechthaler | C23C 14/0641 106/286.4 |
| 2012/0091126 A1* | 4/2012 | Fitzwater | H05B 6/6494 219/730 |
| 2013/0136920 A1 | 5/2013 | Tuffe et al. | |

FOREIGN PATENT DOCUMENTS

| | | | | |
|---|---|---|---|---|
| FR | 2897250 A1 | 2/2006 | | |
| FR | 2956310 A1 | 2/2010 | | |
| JP | 2010202917 A | 9/2010 | | |
| WO | 2004/084690 A1 | 10/2004 | | |
| WO | WO 2005111256 A1 * | 11/2005 | .......... | C23C 14/025 |
| WO | 2010/117649 A1 | 10/2010 | | |

* cited by examiner

STAIN-RESISTANT COOKING SURFACE AND COOKWARE ITEM OR ELECTRICAL HOUSEHOLD APPLIANCE COMPRISING SUCH A COOKING SURFACE

CROSS-REFERENCE TO RELATED APPLICATIONS

This application is the United States national phase of International Application No. PCT/EP2012/073007 filed Nov. 19, 2012, and claims priority to French Patent Application No. 1160583 filed Nov. 21, 2011, the disclosures of which are hereby incorporated in their entirety by reference.

FIELD OF THE INVENTION

The present invention relates to the field of cookware items and electrical household appliances designed for cooking food, and more particularly to the cooking surface of these cookware items and electrical household appliances in contact with the food to be prepared.

The present invention aims to improve hard cooking surfaces that are likely to be cleaned with a scouring pad, without resulting in the formation of scratches.

DESCRIPTION OF RELATED ART

Stainless steels are commonly used for producing cooking surfaces. However, stainless steels lack sufficient hardness to withstand cleaning with a scouring pad. Furthermore, these materials exhibit staining effects during cooking as well as food sticking effects during cooking.

Patent Applications FR 2 848 797, FR 2 883 150, and FR 2 897 250 disclose cooking surfaces that are harder than stainless steel. Specifically, these surfaces have the property of being relatively easy to clean after use as surfaces for cooking food, wherein this ease in cleaning may be expressed by the possibility of easily removing elements baked onto the cooking surface. Nevertheless staining effects have been observed on such cooking surfaces upon contact with certain foods. These staining effects occur on deposits of various structures and compositions, without the surface preparation carried out prior to said deposits modifying the appearance and/or the size of these stains. Analyses of this effect show that such stains essentially form when cooking with animal fats, specifically by the fats reacting with the surface and/or by oxidation of the surface.

French Patent Application 2 956 310 discloses a cooking surface for cookware items or electrical household cooking appliances, consisting of a deposit of Zr and/or Nb and/or Ti on a substrate, the production comprising a step of carburization and/or nitridation of at least one of the elements, this cooking surface also comprising a Si deposit for producing (Zr/Nb/Ti)—Si—(N/C)-type coatings. It has been observed that the presence of Si in the aforementioned transition metal deposits can slightly improve the resistance of the cooking surface thus obtained to staining. However, such a composition does not effectively counteract the oxidation effects causing the staining of the cooking surface, specifically when cooking at high temperatures. Furthermore, when cooking certain foods such as potatoes or fish, these coatings are still subject to sticking effects. These surfaces therefore cannot be cleaned satisfactorily.

The object of the present invention is to propose a cooking surface with effective scratch resistance and also with effective stain resistance.

Another additional object of the present invention is to propose a cooking surface that is easy to clean and durable over time.

An additional object of the present invention is to propose a cooking surface on which the sticking of food during cooking is negligible.

Another additional object of the present invention is to propose a cooking surface with a color and appearance that remain stable.

SUMMARY OF THE INVENTION

These objects are achieved with a food cooking surface for cookware items or electrical household cooking appliances, consisting of a deposit of nitride of metal elements on a substrate, the metal elements of the deposit comprising one or more X transition metal(s) and aluminum, the production of said deposit comprising a nitridation step to obtain a coating of the (X,Al)N type, wherein the (X,Al)N-type coating is a coating of nitride(s) of the one or more X transition metal(s), enriched with aluminum, in which niobium and/or zirconium make(s) up the majority of the X transition metal(s) and the atomic ratio of aluminum in the metal elements of said deposit is at least 20%.

The expression "(X,Al)N-type coating" is understood to mean a nitride coating comprising the one or more X transition metal(s) and aluminum, wherein a nitridation step is carried out during or after the deposition of the aforementioned metal elements. The surface layer of the deposit forming the cooking surface is thus a nitride of the one or more X transition metal(s) enriched with aluminum. The expression "nitride of the one or more X transition metal(s), enriched with aluminum" is understood to mean a coating having a crystalline structure like that of a nitride of one or more transition metals and not like that of a hexagonal aluminum nitride. The expression "the (X,Al)N-type coating is a coating of nitride(s) of the one or more X transition metal(s), enriched with aluminum, in which niobium and/or zirconium make(s) up the majority of the X transition metal(s)" is understood to mean, in the case of several transition metals, a coating comprising only one nitride, e.g., a mixed nitride of Zr and Nb enriched with aluminum, or several nitrides, e.g., a nitride of Zr or of Nb making up the majority and a nitride of Ti or of Cr making up the minority, these nitrides being enriched with aluminum.

Although aluminum nitride deposits effectively resist staining and are easy to clean, the latter lack sufficient hardness for resisting scratches satisfactorily. Furthermore, these deposits are not dishwasher resistant.

The addition of aluminum in the aforementioned ratios for obtaining a (X,Al)N-type coating can significantly improve the oxidation resistance properties and consequently the resistance to staining of the coating, while still maintaining a high level of hardness. Similarly, measurements have shown that this also contributes to less sticking of food during cooking.

The one or more X transition metal(s) does/do not necessarily make up the majority in relation to the aluminum.

According to a preferred embodiment, the one or more X transition metal(s) is/are chosen from Nb and/or Zr. Niobium and zirconium can in fact be used to obtain NbN, ZrN, or (Zr,Nb)N nitrides exhibiting ease in cleaning properties.

Hence the present invention proposes improving the chemical inertness of prior art layers based on one or more transition metals such as Nb and/or Zr in nitride form as cooking surfaces by the addition of aluminum during production.

Although deposits of nitrides of one or more transition metals such as Nb and/or Zr exhibit satisfactory hardness and effective dishwasher resistance, their resistance to staining is inadequate. Furthermore, these deposits are subject to certain foods sticking tightly during cooking and are hard to clean.

Various studies and analyses have shown that deposits of mixed nitrides of one or more transition metals such as Nb and/or Zr and aluminum in the aforementioned ratios can significantly reduce the sensitivity to staining. These deposits are also dishwasher compatible.

Also, various tests have shown that the addition of aluminum in the aforementioned ratios makes it possible to maintain sufficient hardness while enhancing the resistance to scratching.

Advantageously, the atomic ratio of aluminum in the metal elements of said deposit is between 20% and 75%. The (X,Al)N-type coatings with these features exhibit satisfactory scratch resistance and stain resistance properties.

Advantageously still, the atomic ratio of aluminum in the metal elements of said deposit is between 40% and 75%. A substantial ratio of aluminum in the metal elements of the deposits furthermore can reduce the sticking of foods and improve the ease in cleaning.

Surprisingly, the addition of a substantial fraction of aluminum not only did not diminish the capability of these layers of being easily cleaned after their use as cooking surfaces, but even reinforced this property, thus considerably improving the different qualities of these layers beyond the initial goal.

Advantageously still, the atomic ratio of aluminum in the metal elements of said deposit is between 40% and 60%. These ratios of aluminum in the metal elements of the deposits can significantly reduce the sticking of food to the cooking surface and markedly improve the ease in cleaning. It has also been observed that dishwasher resistance starts to decline at atomic ratios of aluminum greater than 60% due to the excessively high aluminum content.

According to a preferred production method, the deposit is produced by physical vapor deposition, commonly abbreviated PVD. Physical vapor deposition is a prior art method of depositing materials having the advantage of using little material and of being able to adjust the process to produce a thin thickness of material on the substrate for producing the cooking surface, thus reducing the raw material cost of these materials. This deposition technique also makes it possible to obtain deposits that adhere strongly to the substrate on which they are deposited. The risks of the deposit delaminating during use are thus minimized. This feature is significant because the cooking surface must withstand the mechanical stresses imposed by the use of forks, knives, and other kitchen accessories while manipulating food in a cooking utensil such as a cookware item or an electrical household cooking appliance comprising said cooking surface.

When the physical vapor deposition technique is used, the physical atomization is obtained by applying a voltage difference between surfaces including at least one substrate on which the deposit will be formed and one or several targets. The deposit is advantageously formed from one or several targets obtained by assembling one or several sheets or plates of material having the desired composition on a conductive support, said sheets or plates being obtained by lamination, powder sintering, thermal spraying of powder, or casting. In general use can be made of any physical vapor deposition technique such as, for example, reactive cathodic arc evaporation.

The deposit is advantageously produced under reactive conditions, i.e., in the presence of a reactive gas such as nitrogen, in order to carry out the nitridation step during the deposition step, thus cutting back on the treatment time while increasing the hardness of the coatings.

Alternatively, deposits produced by chemical vapor deposition (CVD) techniques are also conceivable. However, only plasma-assisted CVD is conceivable for producing the desired coating, wherein the deposits are then produced at low temperature and low pressure. The substrate is exposed to the gaseous precursors, which react and decompose on the surface of the substrate in order to generate the desired deposit. The plasma increases the reaction rate of the precursors and enables deposition at lower temperatures typically between 200 and 500° C.

In order to optimize the treatment times and the cost of this coating, the (X,Al)N nitride deposit produced is between 3 and 10 μm, and preferably between 4 and 6 μm in thickness. In fact a minimum thickness of 3 to 4 μm is needed to obtain a coating completely resistant to scratching with a scouring pad such as a Scotch Brite® Green pad loaded with alumina particles.

According to a preferred method of embodiment, a metal deposit layer of one or several constituents is produced before the nitridation phase in order to strengthen the adhesion between the coating and the substrate. Moreover, the deposition of a metal layer is faster than the deposition of this same layer with a reactive gas, thus speeding up the deposition overall. If desired, use can be made of an oxynitride adhesion layer deposited on the substrate.

The substrate can be composed of one or several metal sheets of the following materials: aluminum, copper, cast iron, steel, specifically stainless steel. Specifically, the substrate can be formed by a material with a co-laminated sandwich structure such as, e.g., stainless steel/aluminum/stainless steel.

The present invention also relates to a cookware item intended for cooking food and comprising a cooking surface as previously described.

Specifically, such a cookware item can be a skillet, a casserole, a Dutch oven, a wok, etc.

The present invention also relates to an electrical household appliance intended for cooking food and comprising a cooking surface and electrically- or gas-operated means for heating said cooking surface, said cooking surface complying with one of the previously described features. Specifically, such an electrical household appliance can be a heating culinary appliance, a raclette cooking appliance, a fondue appliance, a fryer, a bread maker, a rice cooker, etc.

BRIEF DESCRIPTION OF THE DRAWINGS

The invention will be more clearly understood by studying two exemplary embodiments which are not limiting in any way, one of which and some properties are illustrated in the appended figures. Shown are.

DETAILED DESCRIPTION OF THE INVENTION

Figure 1:
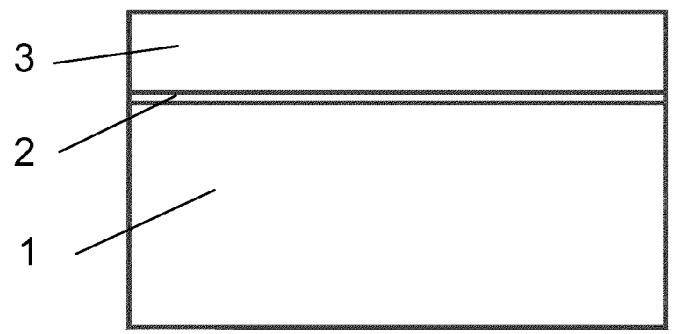
FIG. 1 is a cutaway view of an embodiment of a cooking surface of the invention in which an adhesive layer 2 is interposed between a substrate 1 and a nitride layer 3.

The first exemplary embodiment of the present invention relates to the deposition of (Nb,Al)N-type coatings on a substrate.

The substrate can advantageously be composed of one or several metal sheets of the following materials: aluminum, copper, cast iron, steel, specifically stainless steel. Preference is given to the substrate used being an austenitic stainless steel (such as a type 304 stainless steel), after electrolytic degreasing and ionic descaling of the substrate. More generally, the cookware item is composed of a material with a sandwich structure comprising three co-laminated films, with an aluminum film interposed between two stainless steel films in order to obtain a "tri-ply" stainless steel/aluminum/stainless steel material.

In order to compare the properties obtained, several compositions with atomic percentages of aluminum of 2%, 13%, 22%, 53%, 59%, and 75%, as well as NbN and AlN deposits produced under similar conditions, have been tested.

The deposits are produced by the physical vapor deposition (PVD) technique, more particularly by reactive magnetron cathode sputtering. Dense deposits that adhere to the substrate as well as a relatively fast deposition rate are achievable with the magnetron cathode sputtering technique. However, other PVD techniques (cathodic arc) are conceivable.

The deposit is typically produced from one or several targets obtained by assembling one or several sheets or plates of material having the desired composition on a conductive support, said sheets or plates being obtained by lamination, powder sintering, thermal spraying of powder, or casting.

The production method is thus a reactive vapor deposition wherein, after creating a vacuum in the chamber, essentially only the argon needed for creating the plasma remains; the sputtering of the metal target is effected by introducing nitrogen into the argon plasma such that a niobium nitride enriched with aluminum of the (Nb,Al)N type is obtained by the sputtering of the one or more metal targets. The (Nb, Al)N deposit can be obtained by the sputtering of a Nb—Al composite target or of two separate Nb and Al targets. With deposition under reactive conditions, it is possible to carry out the nitridation step during the deposition step.

Various production parameters can be modified in order to vary the deposition rate (thickness of the coating) and the quality of the deposit, with the aim of obtaining layers sufficiently thick so that they can be characterized but not excessively thick so that effective adhesion to the substrate is maintained.

The choice was made to use a magnetron to increase the deposition rates and still obtaining dense and pure coatings by reducing the pressure in the chamber.

Furthermore, the influence of the nitrogen flow rate, specifically on deposition speed and on the crystalline structure of the coating, made it possible to find an optimum flow rate range for obtaining a deposition speed of around 1.5 μm/h to 4 μm/h. It was also noted that the addition of aluminum tended to reduce the deposition speed in cases in which a NbAl alloy target was used.

One of the features of layers is the measurement of their thicknesses with the aid of a profilometer, which after amplification makes it possible to transcribe on paper the movements of a stylus moving over the surface of the coating, a sudden discontinuity indicating that the stylus is in contact with the substrate. The measurement of this discontinuity, either by calibrating or by using tables, in turn enables the measurement of the thickness of the coating. Similar results can be obtained by using a non-contact profilometer.

This measurement is complemented by a cross-sectional analysis by scanning electron microscopy. Lastly, the thickness of the coating can be measured by any other method for precisely measuring the thickness of micrometric coatings, such as the Calotest ® method or by light or scanning electron microscopy (SEM) observation of a section (specifically a cross-section) or fracture of the coating.

Another measurement involves the chemical analysis of the coating and is obtained either by a Castaing microprobe or by energy dispersive X-ray spectrometry coupled with a scanning electron microscope, wherein the de-excitation of electrons of the coating atoms after electron bombardment is observed and thus indicates the nature of the element that emitted the excited electron, or by Bragg-Brentano geometry X-ray diffraction for identifying the different crystalline phases of the layer.

To vary the percentage of aluminum present in the (Nb, Al)N deposit more easily, preference is given to using separate Nb and Al targets. Different deposits were produced while still conserving the parameters optimized for the NbN deposit, as noted above. The Al content of the different coatings can be measured by EDS analysis.

Assuming that the NbN compound is stoichiometric, after determining which elements are present it is then possible to determine the atomic concentration of Al based on the Al/Nb ratio.

The substrate is advantageously composed of three successive layers of ferritic stainless steel, aluminum, and austenitic stainless steel, all of these layers having a thickness of 0.4 mm. Before depositing the selected coating, a NbAl or oxide layer with a maximum thickness of 1 μm is applied in order to ensure good adhesion between the austenitic stainless steel of the substrate and the coating.

The coating is then deposited with a sufficient thickness (about 3 μm) before being subjected to cooking and the ease in cleaning test using a plynometer. Advantageously, the thickness of the (X,Al)N nitride deposit produced is between 3 and 10 μm, and preferably between 4 and 6 μm.

If desired, a metal or oxide layer of one or several of the constituents can be deposited prior to the nitridation phase in order to form an adhesion layer 2 between the substrate 1 and the nitride layer 3, as shown in FIG. 1.

Comparative scratch resistance tests have been conducted with the following cooking surfaces: stainless steel (bright annealed finish, with a mean roughness (Ra) of around 0.1 μm), and coatings of the NbN, ZrNbN (60% Nb and 40% Zr, or stoichiometric), and (Nb,Al)N type with different atomic percentages of aluminum based on the total metal elements, specifically 2%, 13%, 22%, 43%, 53%, and 70% Al.

Scratch resistance was evaluated with a scouring pad of the Scotch Brite ® Green type (loaded with alumina particles).

For obtaining a coating completely resistant to scratching according to the abovementioned test, it is necessary to have a coating with a substantial hardness as well as a minimum coating thickness of 4 μm.

NbN and ZrNbN coatings exhibit sufficient hardness for obtaining a surface that cannot be scratched by Scotch Brite ® Green pads. The AlN coating, however, has a lower hardness and is not scratch resistant.

Figure 2:
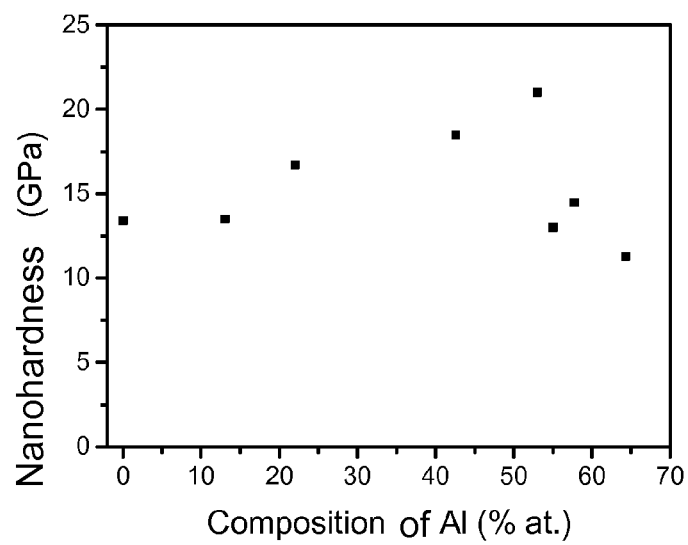
FIG. 2 illustrates measurements of nanohardness (expressed in GPa) taken on (Nb,Al)N-type coatings, in relation to the atomic percentage of aluminum (ranging from 0 to 65% Al).

FIG. 2 shows how the hardness of the coating changes in relation to the level of aluminum (from 0 to 65% Al). These measurements show that comparatively (in the 0→53% Al range of aluminum levels), the hardness of the deposit can be increased by the addition of aluminum. These tests show that the hardness of (Nb, Al)N-type coatings is sufficient for ensuring effective resistance to scratching and is even higher than that of NbN. Furthermore, it has been proven that a coating totally resistant to scratching by a Scotch Brite ® Green scouring pad can be obtained with 4μm thick coating of the (Nb,Al)N type with 70% Al. In these cases, the DRX measurements showed that all of these deposits had the face-centered cubic structure of NbN (with the substitution of aluminum in the NbN lattice cell). A solid solution hardening effect accounts for the increase in the hardness of the coatings with respect to the aluminum concentration. Above a critical level of aluminum, the possible formation of an amorphous phase rich in aluminum may account for the lowering of the hardness of the coatings observed prior to the transition to the hexagonal crystalline structure of AlN.

The staining of the NbN coating during cooking is for the most part brought about by an oxidation effect leading to an interferential oxide layer. A very slight variation in the thickness of the oxide on the surface of the NbN coating (of ca. 10 to 20 nm) may cause a change in the color of the coating perceived by an observer as a result of an interferential coloring effect. A greater oxide thickness has in fact been measured in the stained zones than in the non-stained zones.

The use of a coating having very low oxidation kinetics at the cooking temperature can reduce or even prevent staining. This anti-staining function of the coating is achievable owing to the excellent oxidation resistance of aluminum nitride at temperatures as high as 600° C. Hence a skillet with an AlN-type coating was produced and no staining was observed after the cooking test owing to its excellent resistance to oxidation. However, the low hardness of the AlN coating renders it unsuitable for use as is (the AlN coating is not resistant to scratching by Scotch Brite ® Green). However, a coating combining the high hardness brought about by NbN and the high oxidation resistance brought about by AlN can be obtained by adding aluminum to a NbN coating with good hardness properties. The objective is to have a coating sufficiently resistant to oxidation so that it will not stain at the working temperature of a skillet (up to 350° C. if the latter is heated on high while empty).

The tests to evaluate staining were performed according to the following protocol:
  5 min of preheating the coating at 350° C.,
  Deposition of a drop of a staining mixture, e.g., 90% oleic acid, 9.9% vitamin E, 0.1% carotene,
  Heating under air for 5 min at 350° C.,
  Manual cleaning of the charred residue until the cooking surface appears,
  Visual estimation of the staining.

The (Nb, Al)N samples tested comprised the following atomic ratios of aluminum: 0% (NbN), 2%, 13%, 22%, 43%, 53%, 59%, 75% Al; 100% (AlN). The stained samples were the NbN and (Nb,Al)N ones with 2% and 13% Al. In contrast, the (Nb, Al)N samples with 22%, 43%, 53%, 59%, 75% Al and the AlN sample were not stained. Based on these results, a minimum atomic percentage of aluminum of ca. 20% (of the metal elements of the coating) is considered necessary for ensuring that the coating is resistant to staining during cooking.

The ease in cleaning tests were conducted according to the following protocol: the surface to characterize was coated with a food composite mixture with strong adhesion properties after charring. The charred mixture is then subjected to the action of a scouring pad.

The following is an example of the food composite mixture: 34 mg/ml glucose, 14.5 mg/ml amylopectin, 39 mg/ml ovalbumin, 13.5 mg/ml casein, 32.8 mg/ml linoleic acid. After baking for 20 min at 210° C. and cooling for 2 min, the sample is soaked in a mixture of water and detergent for 5 min, and then cleaned with a plynometer (appliance for scouring cooking residues). The ease in cleaning of the cooking surface is evaluated on the basis of the percent of the surface still coated with cooking residue.

The table below shows the ease in cleaning for various kinds of cooking surfaces: stainless steel, ZrNbN (66.6% Zr, 33.3% Nb), and (Nb,Al)N for the following atomic percentages of Al: 0% (NbN); 2%, 12%, 22%, 41%, 53%, 59%, 76%, and 100% (AlN); the tests were performed on surfaces with a maximum area of 2 cm².

| Cooking surface material | % of the surface still coated with cooking residue after cleaning | Standard deviation |
| --- | --- | --- |
| Stainless steel | 80 | 10 |
| ZrNbN | 31.5 | 20 |
| NbN | 91 | 5 |
| NbAlN 2% Al | 92.9 | 5 |
| NbAlN 12% Al | 82.9 | 15 |
| NbAlN 22% Al | 62.2 | 20 |
| NbAlN 41% Al | 78.45 | 5 |
| NbAlN 53% Al | 36.05 | 40 |
| NbAlN 59% Al | 37.85 | 20 |
| NbAlN 76% Al | 13.1 | 10 |
| AlN | 0 | 0 |

A higher Al ratio is apparently required for obtaining satisfactory ease in cleaning than for obtaining satisfactory resistance to staining. In fact the ease in cleaning is significantly improved in relation to the stainless steel for the samples comprising 53% and 59% Al, and very significantly improved for the samples comprising 76% Al.

Thus it is possible to obtain much better resistance to staining with a (Nb,Al)N-type cooking surface with at least 20% Al than with a stainless steel, NbN, or ZrNbN cooking surface.

Furthermore, a greater ease in cleaning can be obtained with a (Nb,Al)N-type cooking surface having an atomic ratio of aluminum greater than or equal to 40% than with either a stainless steel cooking surface or a ZrNbN surface, and such a surface is also highly resistant to staining. The ease in cleaning can be significantly improved over that of an NbN coating by adding aluminum. The higher the level of aluminum, the more dramatic the improvement in ease in cleaning.

A (Nb,Al)N-type cooking surface with an atomic ratio of Al greater than or equal to 65% furthermore makes it possible to obtain a remarkable ease in cleaning, in particular superior to that of ZrNbN. However, good dishwasher resistance can be obtained with a (Nb,Al)N-type cooking surface having an atomic ratio of aluminum ranging from 40% to 60%.

It was also noted that the color of the coating forming the cooking surface was modified in relation to the aluminum content of the coating. A NbN coating has a slightly darker color than a stainless steel one. As the aluminum content increases, the NbAlN deposit becomes darker. The coating is anthracite in color with an Al content of 75%.

Surprisingly, the cooking surface of the invention makes it possible to combine the advantages of NbN (high hardness conferring good resistance to scratching, resistance to detergents such as those used in dishwashers) with the advantages of AlN (very good resistance to oxidation conferring very good resistance to staining, ease in cleaning, less sticking of food during cooking) without the respective disadvantages (the low hardness and poor resistance to detergents such as those used in dishwashers of AlN, the poor resistance to oxidation contributing to staining, difficulty in cleaning, and sticking of certain food during cooking of NbN).

A (Nb,Al)N-type coating with an atomic ratio of aluminum ranging from 20% to 75% of the metal elements thus has interesting stain resistance and scratch resistance properties owing to a high hardness (of ca. 15 GPa, higher than that of NbN) and owing to resistance to the detergents used in dishwashers. Furthermore, high aluminum ratios contribute to ease in cleaning.

The second exemplary embodiment of the present invention relates to the deposition of a ZrN coating and the influence of an addition of aluminum. The cooking surface thus consists of a (Zr,Al)N-type deposit.

A test of (Zr,Al)N-type coatings applied by magnetron cathodic sputtering was conducted on a skillet-type cookware item for an atomic percentage of aluminum ranging from 30% to 70%. This test enabled the resistance of such a coating to staining and scratching to be validated.

As with niobium, the first step consisted of determining the best conditions for depositing ZrN prior to producing (Zr,Al)N composites.

The ZrN coating alone is a coating that is easily cleaned, and the addition of aluminum enhances this property.

Stains, which are present to a lesser extent on ZrN coatings than on NbN coatings at the outset, disappear when the coatings are doped with aluminum.

As with niobium nitride, aluminum can improve certain properties of nitrides of X transition metal(s) in groups 4, 5, and 6 of the periodic table (e.g., Zr, Ti, Cr), namely:

better resistance to oxidation and thus to staining of a (X,Al)N-type coating versus an XN-type coating, for an atomic percentage of Al of at least 20%, higher hardness and thus greater resistance to scratching, the atomic percentage of Al making it possible to maintain a crystalline structure of an XN coating rather than that of an AlN coating.

The present invention thus relates to a food cooking surface for a cookware item or an electrical household cooking appliance, consisting of a deposit of metal element nitrides on a substrate, the metal elements of the deposit comprising an X transition metal and aluminum, the production of said deposit comprising a nitridation step for obtaining a coating of the (X,Al)N type.

More particularly according to the invention, the coating of the (X,Al)N type is a nitride of the X transition metal enriched with aluminum and not a nitride of aluminum enriched with an X transition metal. Furthermore, the atomic ratio of aluminum in the metal elements of said deposit is at least 20%.

In the exemplary embodiments cited, the X transition metal is chosen from niobium or zirconium.

Alternatively, the transition metal could be chosen from other elements of groups IV, V, and VI of the periodic table for producing coatings of other nitrides of transition metals doped with aluminum, except for (Ti,Al)N or (Cr,Al)N. Tests have in fact shown that the cleaning performances were markedly inadequate for certain stains on (Ti,Al)N or (Cr,Al)N, strong acids being needed to remove them.

Alternatively, the present invention also relates to the production of coatings that are not necessarily based on nitrides of one X transition metal enriched with aluminum, but based on nitrides comprising several transition metals, specifically Nb and/or Zr and/or Ti and/or Cr, combined with aluminum, wherein the niobium and/or the zirconium make (s) up the majority of the one or more X transition metal(s), with the aim of increasing the hardness and/or modifying the color of the coating.

The present invention also relates to a cookware item intended for cooking food and comprising a cooking surface of the aforementioned type.

The present invention also relates to an electrical household appliance intended for cooking food, comprising a cooking surface and electrically- or gas-operated means for heating said cooking surface, and comprising a cooking surface of the aforementioned type.

The present invention is not limited in any way to the exemplary embodiments described herein, but encompasses numerous modifications in the scope of the claims.

The invention claimed is:

1. An electrical household cooking appliance for cooking food comprising: a food cooking surface of the electrical household cooking appliance consisting of a deposit of nitride of metal elements on a substrate of the electrical household cooking appliance, the metal elements of the deposit of nitride of metal elements consisting of niobium and aluminum, a production of said deposit comprising a nitridation step for obtaining a (Nb,Al)N-type coating, and further wherein an atomic ratio of aluminum in the metal elements of said deposit is between 40% and 60%.

2. The electrical household cooking appliance for cooking food as in claim 1, wherein a metal deposit layer of one or several of the constituents or an oxide deposit layer of one or several of the constituents is produced before the nitridation phase.

3. The electrical household cooking appliance for cooking food as in claim 2, wherein the metal deposit layer of one or several of the constituents or the oxide deposit layer of one or several of the constituents produced before the nitridation phase has a maximum thickness of 1 μm.

4. The electrical household cooking appliance for cooking food as in claim 1, wherein the substrate is composed of one or several metal sheets of the following materials: aluminum, copper, cast iron, steel, and stainless steel.

5. The electrical household cooking appliance for cooking food as in claim 1, wherein said deposit produced is between 4 and 6 μm in thickness.

6. The electrical household cooking appliance for cooking food as in claim 1, wherein said deposit produced is between 3 and 10 μm in thickness.

7. A cookware item for cooking food comprising: a food cooking surface of the cookware item consisting of a deposit of nitride of metal elements on a substrate of the cookware item, the metal elements of the deposit of nitride of metal elements consisting of niobium and aluminum, a production of said deposit comprising a nitridation step for obtaining a (Nb,Al)N-type coating, and further wherein an atomic ratio of aluminum in the metal elements of said deposit is between 40% and 60%.

8. The cookware item for cooking food as in claim 7, wherein a metal deposit layer of one or several of the constituents or an oxide deposit layer of one or several of the constituents is produced before the nitridation phase.

9. The cookware item for cooking food as in claim 8, wherein the metal deposit layer of one or several of the constituents or the oxide deposit layer of one or several of the constituents produced before the nitridation phase has a maximum thickness of 1 μm.

10. The cookware item for cooking food as in claim 7, wherein the substrate is composed of one or several metal sheets of the following materials: aluminum, copper, cast iron, steel, and stainless steel.

11. The cookware item for cooking food as in claim 7, wherein said deposit produced is between 4 and 6 μm in thickness.

12. The cookware item for cooking food as in claim 7, wherein said deposit produced is between 3 and 10 μm in thickness.

\* \* \* \* \*